US010832991B1

(12) United States Patent
Cook et al.

(10) Patent No.: US 10,832,991 B1
(45) Date of Patent: Nov. 10, 2020

(54) LEADLESS PACKAGED DEVICE WITH METAL DIE ATTACH

(71) Applicant: Texas Instruments Incorporated, Dallas, TX (US)

(72) Inventors: Benjamin Stassen Cook, Addison, TX (US); Nazila Dadvand, Richardson, TX (US); Sreenivasan Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/404,958

(22) Filed: May 7, 2019

(51) Int. Cl.
| *H01L 23/495* | (2006.01) |
| *H01L 23/00* | (2006.01) |
| *H01L 23/31* | (2006.01) |
| *C25D 3/38* | (2006.01) |

(52) U.S. Cl.
CPC .......... *H01L 23/49513* (2013.01); *C25D 3/38* (2013.01); *H01L 23/3121* (2013.01); *H01L 24/09* (2013.01); *H01L 24/33* (2013.01); *H01L 24/49* (2013.01); *H01L 24/73* (2013.01); *H01L 2224/73265* (2013.01)

(58) Field of Classification Search
CPC . C25D 3/38; H01L 23/3121; H01L 23/49513; H01L 24/09; H01L 24/33; H01L 24/49; H01L 24/73
See application file for complete search history.

(56) References Cited

U.S. PATENT DOCUMENTS

| 6,011,694 | A | * | 1/2000 | Hirakawa | ........... H01L 23/3128 |
| | | | | | 174/16.3 |
| 6,040,984 | A | * | 3/2000 | Hirakawa | ........... H01L 23/5386 |
| | | | | | 174/261 |
| 6,060,778 | A | * | 5/2000 | Jeong | ...................... H01L 23/13 |
| | | | | | 257/697 |
| 2002/0171137 | A1 | * | 11/2002 | Sota | .................... H01L 25/0657 |
| | | | | | 257/686 |
| 2011/0227233 | A1 | | 9/2011 | Wainerdi et al. | |
| 2012/0199960 | A1 | * | 8/2012 | Cosue | ................. H01L 23/4985 |
| | | | | | 257/668 |
| 2013/0037309 | A1 | * | 2/2013 | Kim | .................. H01L 23/49861 |
| | | | | | 174/251 |
| 2013/0313726 | A1 | | 11/2013 | Uehling | |
| 2017/0178998 | A1 | | 6/2017 | Jeun et al. | |
| 2020/0013709 | A1 | * | 1/2020 | Dadvand | ................. H01L 24/85 |

* cited by examiner

*Primary Examiner* — Allan R Wilson
(74) *Attorney, Agent, or Firm* — Ronald O. Neerings; Charles A. Brill; Frank D. Cimino

(57) ABSTRACT

A leadless packaged semiconductor device includes a metal substrate having at least a first through-hole aperture having a first outer ring and a plurality of cuts through the metal substrate to define spaced apart metal pads on at least two sides of the first through-hole aperture. A semiconductor die that has a back side metal (BSM) layer on its bottom side and a top side with circuitry coupled to bond pads is mounted top side up on the first outer ring. A metal die attach layer is directly between the BSM layer and walls of the metal substrate bounding the first through-hole aperture that provides a die attachment that fills a bottom portion of the first through-hole aperture. Bond wires are between metal pads and the bond pads. A mold compound is also provided including between adjacent ones of the metal pads.

20 Claims, 9 Drawing Sheets

LEADLESS PACKAGED DEVICE WITH METAL DIE ATTACH

CROSS-REFERENCE TO COPENDING APPLICATIONS

This application has subject matter related to copending application Ser. No. 16/026,371 entitled "SEMICONDUCTOR DEVICE WITH ELECTROPLATED DIE ATTACH" that was filed on Jul. 3, 2018.

FIELD

This Disclosure relates to semiconductor device assembly, more specifically to die attachment to a substrate.

BACKGROUND

Packaged semiconductor devices generally comprise an integrated circuit (IC) die which is conventionally a silicon die that is mounted on a die pad of a workpiece such as a leadframe using a die attach adhesive. Other workpieces include an interposer, a printed circuit board (PCB), and another IC die. For IC die assembled top (active) side up and back side down, the die attach adhesive provides a mechanical attachment, and generally also provides an electrical and/or thermal pathway to the die pad. The die attach adhesive generally comprises a polymer such as a polyimide or an epoxy-based adhesive. Silver is often added in particle flake form as a filler to raise both the electrical conductivity and the thermal conductivity as compared to the polymer material.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize conventional die attach solutions comprising metal particle filled polymers have significant thermal and electrical resistance. Since thermal management is becoming more important with the trend for more compact and more highly integrated electronic systems having smaller features and running at higher operating currents, higher thermal conductivity die attach arrangements are needed that also provide a low electrical resistance when back side electrical contact to the semiconductor die is used. It is recognized that although solder die attach, such as eutectic gold (Au), and Au-tin (AuSn), can provide back side electrical contact to the semiconductor die with relatively good thermal and electrical resistance as compared to metal particle filled polymers, solder die attach is relatively expensive, and is limited to solderable die surfaces. Moreover the solder die attach process involves an inert reflow at temperatures that can cause temperature induced stresses to the semiconductor die's metal interconnect.

Disclosed aspects include leadless semiconductor packages where the die attachment is established through an electroplated (plated) metal die attach layer as opposed to solder. Therefore, voiding issues related to Sn—Cu intermetallic formation are eliminated in disclosed leadless packaged semiconductor devices.

Disclosed aspects include a leadless packaged semiconductor device comprising a metal substrate including at least a first through-hole aperture that has a first outer ring, and a plurality of cuts through regions the metal substrate that define spaced apart metal pads (or lead terminals) on at least two sides of the first through-hole aperture. At least a first semiconductor die having a back side metal (BSM) layer on its back side and a top side with circuitry coupled to bond pads is mounted top side up on the first outer ring. A metal die attach layer is directly between the BSM layer and walls of the metal substrate bounding the first through-hole aperture to provide a die attachment that fills a bottom portion of the first through-hole aperture. Bond wires are generally between the metal pads and the bond pads. A mold compound is provided including between adjacent ones of the metal pads.

Another disclosed aspect comprises a multi-chip leadless packaged semiconductor device having a first and a second semiconductor die on respective first and second through-hole apertures. Both of the semiconductor die have a BSM layer directly attached onto the metal substrate by a disclosed metal die attach layer.

BRIEF DESCRIPTION OF THE DRAWINGS

Reference will now be made to the accompanying drawings, which are not necessarily drawn to scale, wherein.

DETAILED DESCRIPTION

Figure 1A:
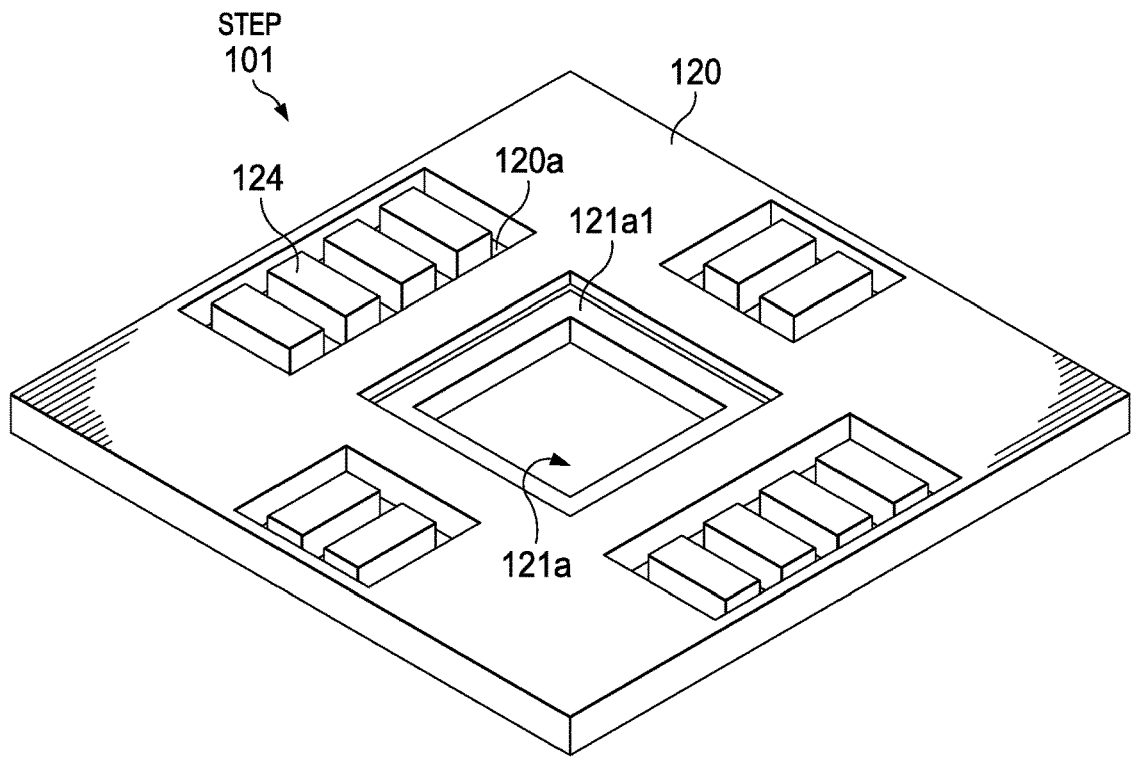
FIG. 1A shows an example metal substrate for an example 12 pin quad flat no lead (QFN) package including thinned metal substrate regions that are between the remainder of the metal substrate that generally has a full thickness, where the thinned metal substrate regions after disclosed back side metal etching become spaced apart metal pads.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

FIGS. 1A-H show successive cross-sectional depictions for an example assembly method for forming a disclosed leadless packaged semiconductor device on a metal substrate 120 including at least a first through-hole aperture 121a that has a first outer ring (first ring) 121$a_1$, where the first semiconductor die 180a has a BSM layer 186 that is on the first ring 121$a_1$, and wherein the BSM layer 186 is attached to the metal substrate 120 by a plated metal die attach layer (metal die attach layer) 187. The metal die attach layer 187 generally consists of a single layer. As used herein, a 'ring' means an enclosed shape, such as being substantially circular, for example elliptical, rectangular, or square shaped.

The metal substrate 120 generally comprises copper (Cu) or a Cu alloy, and the metal substrate 120 may be 150 µm to 350 µm thick. The metal die attach layer 187 can comprise Cu or other electrically conductive material such as nickel, cobalt, or alloys thereof. There are thinned metal substrate regions shown as 120a that are between metal portions of the metal substrate 120 that are precursors to the metal pads shown as 124 that after disclosed back side metal etching described below become metal pads 125 that are electrically isolated from one another by the mold compound in the final leadless packaged semiconductor device, such as leadless packaged semiconductor device 250 shown in FIG. 2B described below.

The thinned metal regions 120a can be formed by stamping, etching or other suitable lead thinning process. The thinned metal regions 120a can have a thickness that is less than 20% of the thickness of the precursors to the metal pads before the below-described back side etching to electrically isolate the metal pads, with a typical thickness range of 1% to 20% of the thickness of the metal pads before disclosed back side metal etching.

Step 101 comprises providing at least one metal substrate 120 generally in the form of a leadframe panel or lead frame sheet including a plurality of the same interconnected metal substrates 120. The metal substrate 120 includes a first through-hole aperture 121a that has a first ring 121$a_1$ that is sized with area dimensions for receiving a first semiconductor die 180a on the first ring 121$a_1$. FIG. 1A shows the metal substrate 120 for an example 12 pin quad flat no lead (QFN) package including thinned metal substrate regions 120a that are between the rest of the metal substrate 120 generally having a full thickness, where the thinned metal substrate regions 120a as noted above will after disclosed back side metal etching become spaced apart metal pads shown as 125.

Figure 1B:
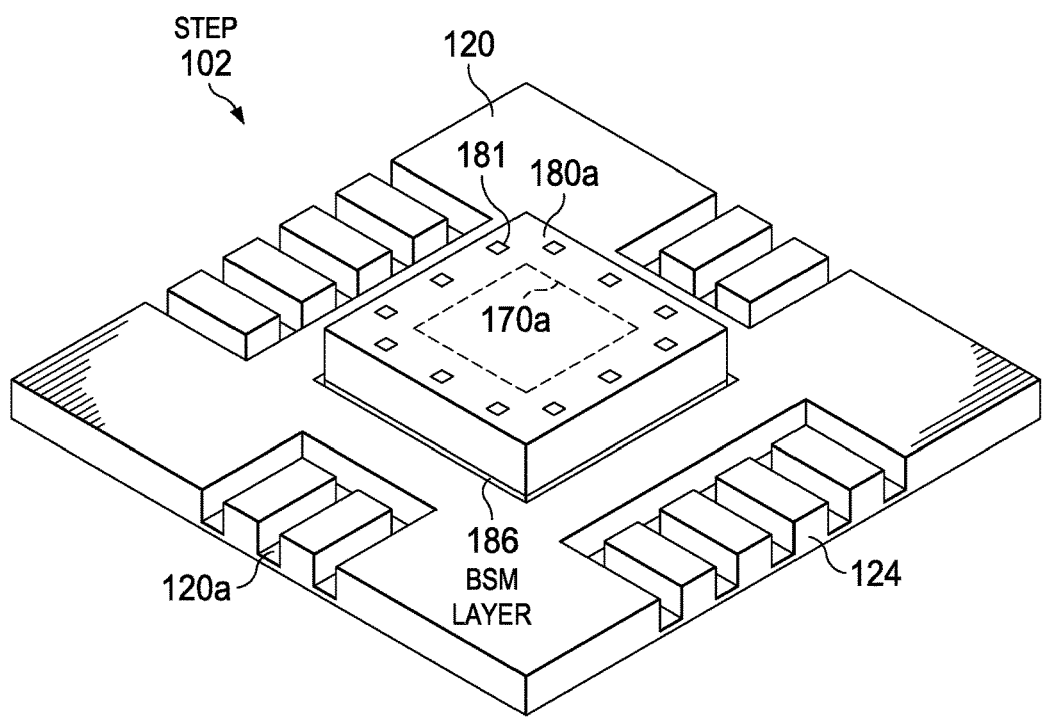
FIG. 1B shows the results after inserting at least a first semiconductor die top (active) side up with a BSM layer on a first ring within a first through-hole aperture.
Figure 1C:
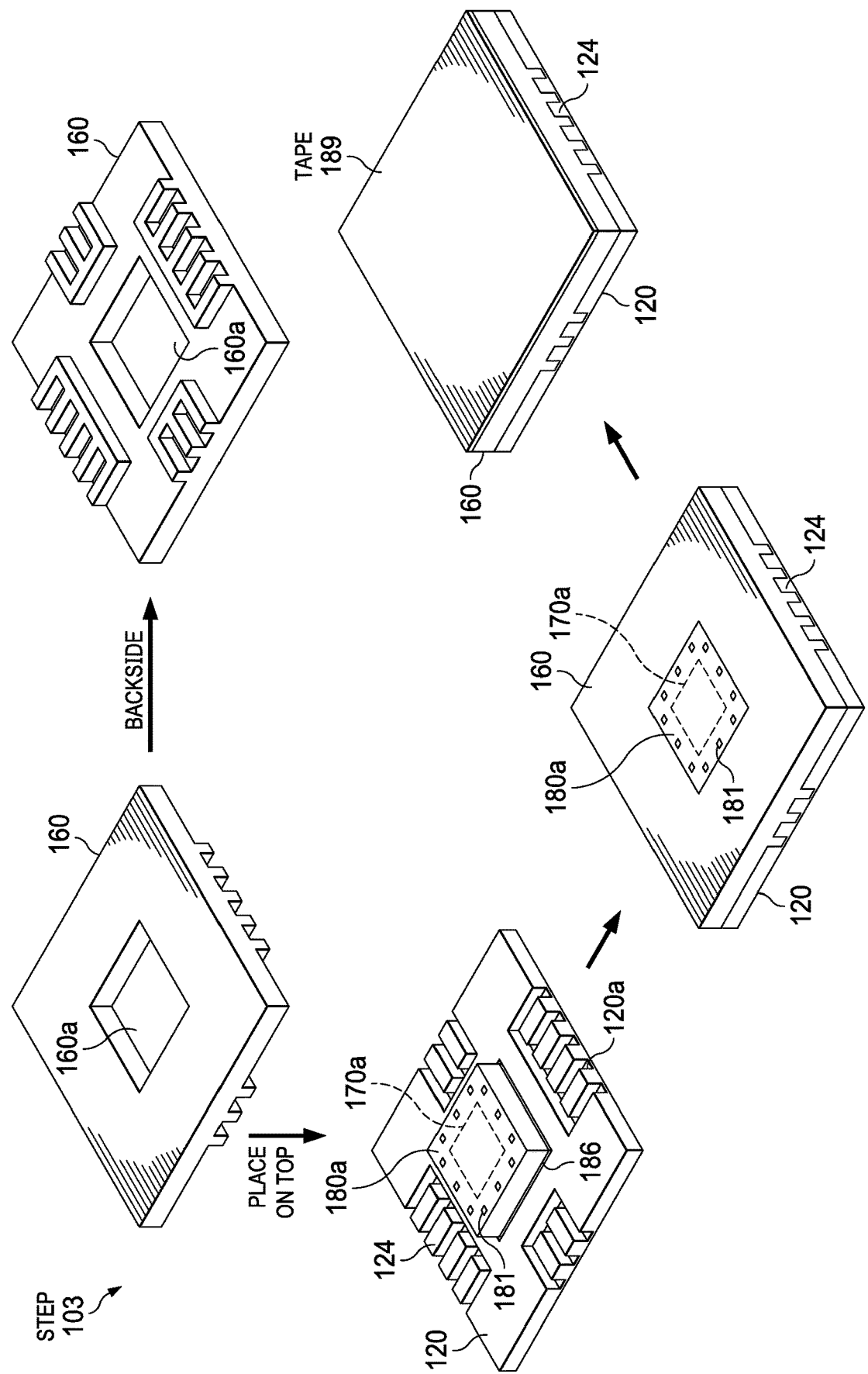
FIG. 1C shows at its top a top side view and a back side view of an example plastic template having a center aperture, where at the bottom of FIG. 1C the plastic template is shown after being placed over the first semiconductor die on the first ring within the first through-hole aperture, followed by adding a tape on the top side.

Step 102 comprises inserting (e.g., picking and placing) at least a first semiconductor die 180a top (active) side up with the BSM layer 186 on the first ring 121$a_1$ within the first through-hole aperture 121a with the result shown in FIG. 1B. The BSM layer 186 may comprise Cu and be 6 µm to 10 µm thick. Before forming the BSM layer 186, the back side of the wafer may be thinned, typically by back grinding, such as to a thickness of 200 to 350 µm, followed by optionally forming of a refractory metal layer (not shown) such as a TiW layer. The top side of the first semiconductor die 180a includes circuitry 170a coupled to bond pads 181 and a back side with a BSM layer 186 thereon. The circuitry 170a comprises circuit elements (including transistors, and generally diodes, resistors, capacitors, etc.) formed in a semiconductor layer (e.g., in an epitaxial layer on a bulk substrate) configured together for generally realizing at least circuit function. Example circuit functions include analog (e.g., amplifier or power converter), radio frequency (RF), digital, or non-volatile memory functions. The bond pads 181 can include Cu pillars or solder bumps thereon.

In step 103, before plating the metal die attach layer 187 on the BSM layer 186, the top side of the first semiconductor die 180a can be covered and/or held shown by a plastic template 160 in order to prevent plating from occurring on the top side of the first semiconductor die 180a, and for also preventing the first semiconductor die 180a from falling off when inside the plating solution. The result of inserting a plastic template 160 having a center aperture 160a over the first semiconductor die 180a is shown in the bottom depiction in FIG. 1C. The plastic template 160 is configured with dimensions to fit over the first semiconductor die 180a and to fit within the thinned metal substrate regions 120a, generally used along with a tape shown as 189 for sealing the top of the first semiconductor die 180a. Alternatively, although not shown, a tape alone (without a plastic template or cover) may be used.

Figure 1D:
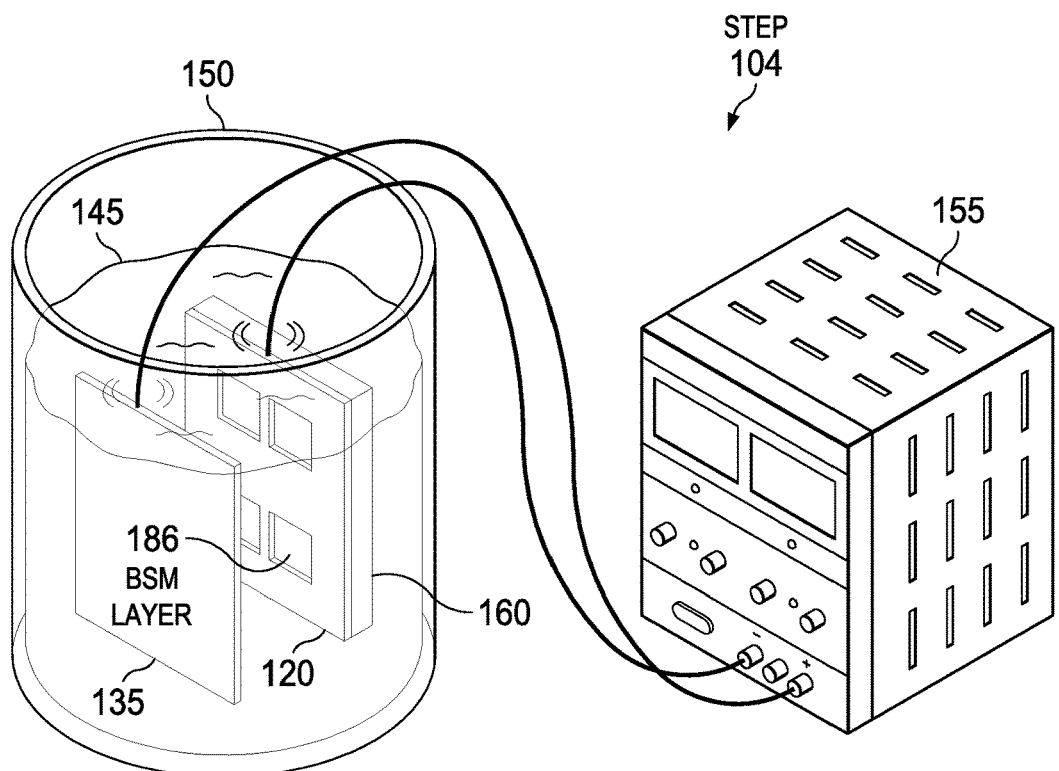
FIG. 1D shows a plating apparatus comprising a power supply along with electrical connections to the metal substrate and to a spaced apart anode for plating the back side of a bottom semiconductor die shown immersed into a plating container that provides an electroplating bath including a plating solution for forming a disclosed plated metal die attach layer.
Figure 1E:
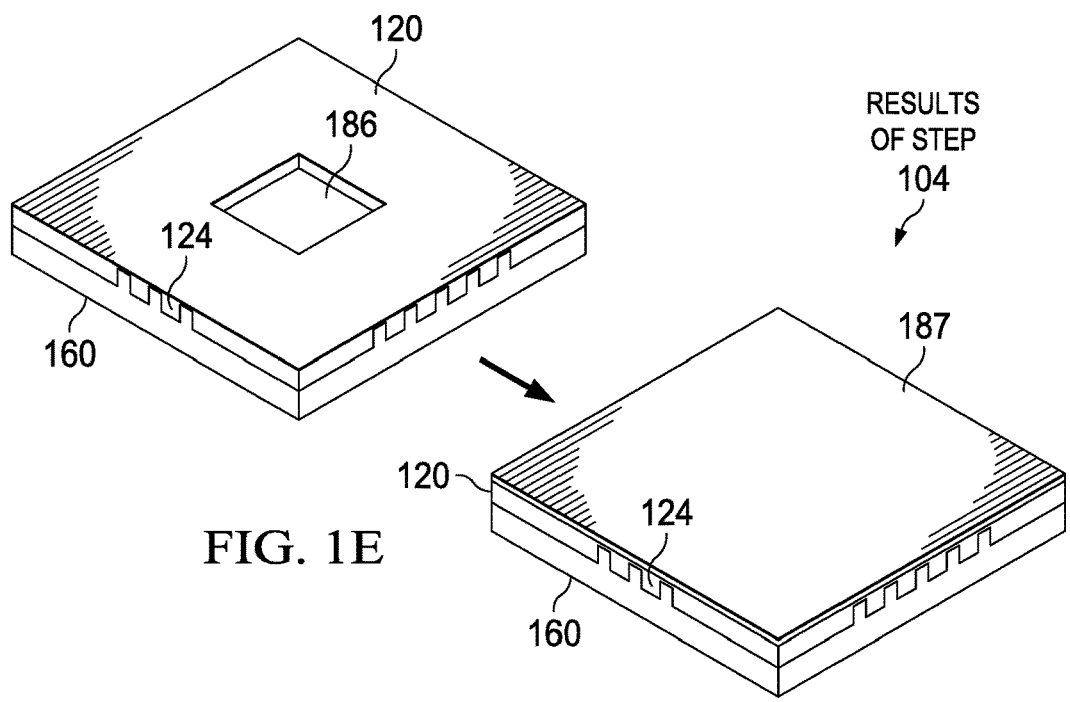
FIG. 1E shows the results of a plating process comprising forming a metal die attach layer that directly contacts at least a portion of the BSM layer, the sidewalls of the first aperture, and a bottom side of the metal substrate.

Step 104 comprises immersing at least the BSM layer 186 of the first semiconductor die 180a and a bottom side of the metal substrate 120 into a plating container 150 that provides an electroplating bath including a plating solution 145, with the plating process apparatus including a power supply 155 along with electrical connections to the metal substrate 120 and to an anode 135 as shown in FIG. 1D. In FIG. 1D the entire first semiconductor die 180a is shown optionally being within the plating solution 145. As a result of the plating process the metal die attach layer 187 is plated by the electroplating process on the BSM layer 186 on the back side of the first semiconductor die 180a and is formed to bond other parts of the first semiconductor die 180a to the metal substrate 120. The metal die attach layer 187 as described above can comprise Cu or another electrically conductive material such as nickel, cobalt, or alloys thereof. FIG. 1E shows the results of the plating process comprising forming a metal die attach layer 187 that directly contacts at least a portion of the BSM layer 186, the sidewalls of the first aperture 121a, and a bottom side of the metal substrate 120.

The plating solution 145 includes an electrolyte containing one or more dissolved metal salts including the metal (e.g., Cu) of interest to electroplate as well as other ions that permit the flow of electricity during plating. As noted above there may also be a sealant provided, such as electroplating solution resistant tape between the plastic template 160 and the metal substrate 120 to avoid plating metal on the top side of the first semiconductor die 180a. For electroplating, the metal substrate 120 is connected to a negative terminal (cathode) of a power supply, and an electrically conductive structure spaced aperture from the metal substrate 120 such as a metal block that functions as an anode 135 is positioned apart from the metal substrate 120 that is connected to a positive terminal (anode) of the power supply 155.

The electroplating is generally performed at a temperature from 15° C. to 30° C. to avoid introduction of temperature induced stresses, such as to the first semiconductor die's 180a interconnect on its top side. At the cathode being the first semiconductor die 180a and metal substrate 120, the dissolved metal ions (e.g., $Cu^{+2}$) in the electrolyte solution are reduced at the interface between the plating solution and the cathode, such that they plate out to a zero valence state metal (e.g., Cu metal) as the metal die attach layer 187 onto the cathode. The electroplating is generally performed using direct current (DC), but can also be performed as pulsed electroplating.

The metal die attach layer 187 fills a portion of the volume under the BSM layer 186 on the bottom side of the first semiconductor die 180a to provide a die attachment, as well as on the bottom side of the metal substrate 120, with the result shown in FIG. 1E after removing the plastic template 160 and/or tape. As noted above, the metal die attach layer 187 being across the entire back side of the first semiconductor die 180a directly contacts at least a portion of the BSM layer 186 to the walls of the aperture 121a. The time for the electroplating process can be calculated by dividing the desired metal die attach layer 187 thickness by the deposition rate. The thickness of the metal die attach layer 187 can be 10 to 250 µm, for example 40 to 200 µm.

Figure 1F:
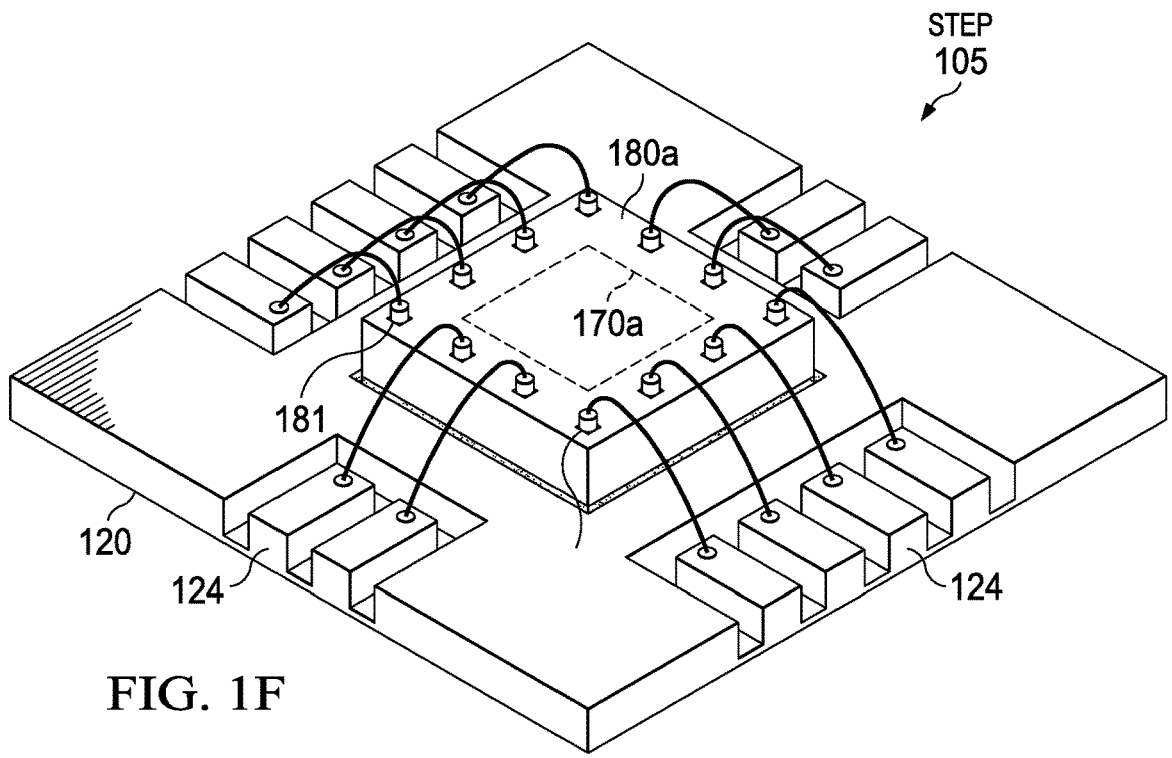
FIG. 1F shows results after wire bonding between the bond pads and precursors for the metal pads.
Figure 1G:
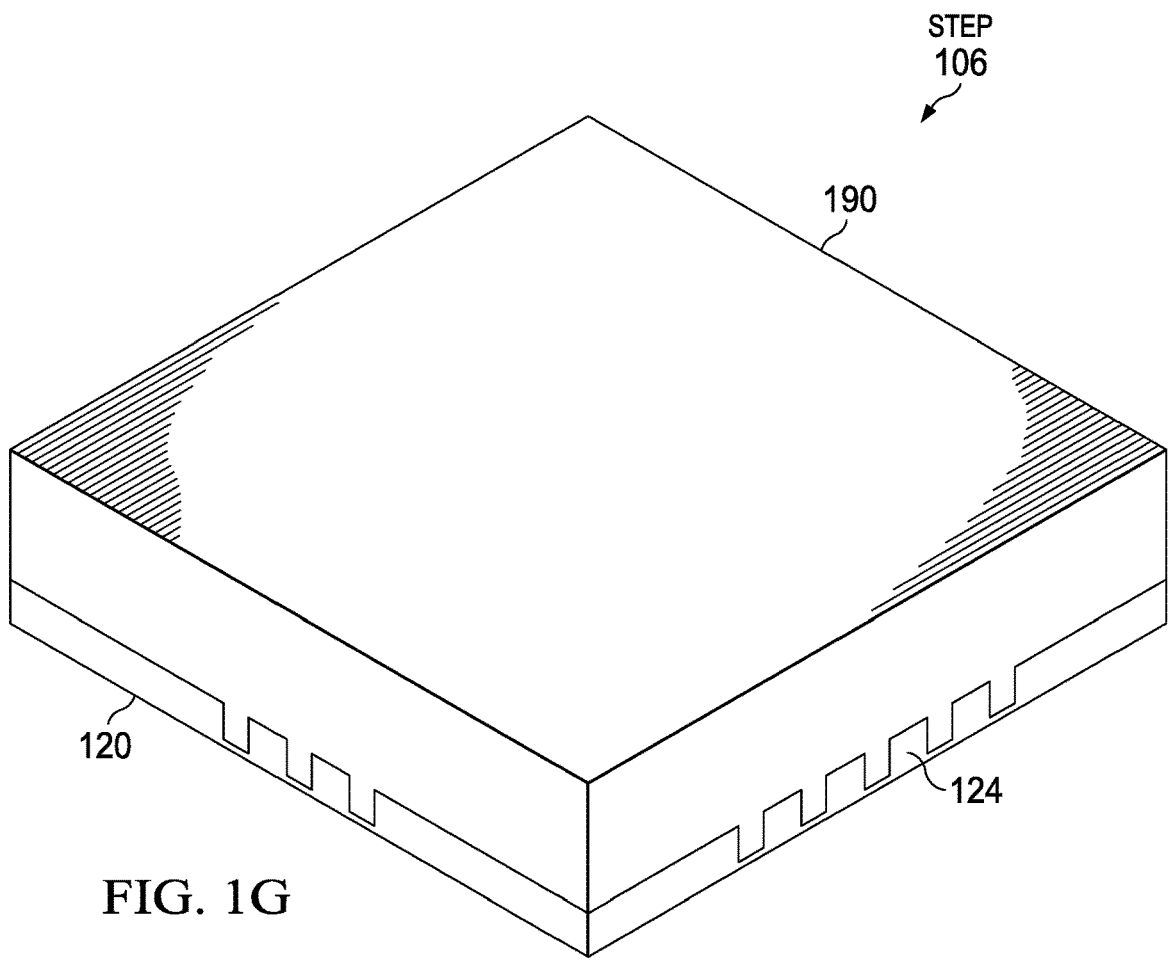
FIG. 1G shows results after molding to form a mold compound.
Figure 1H:
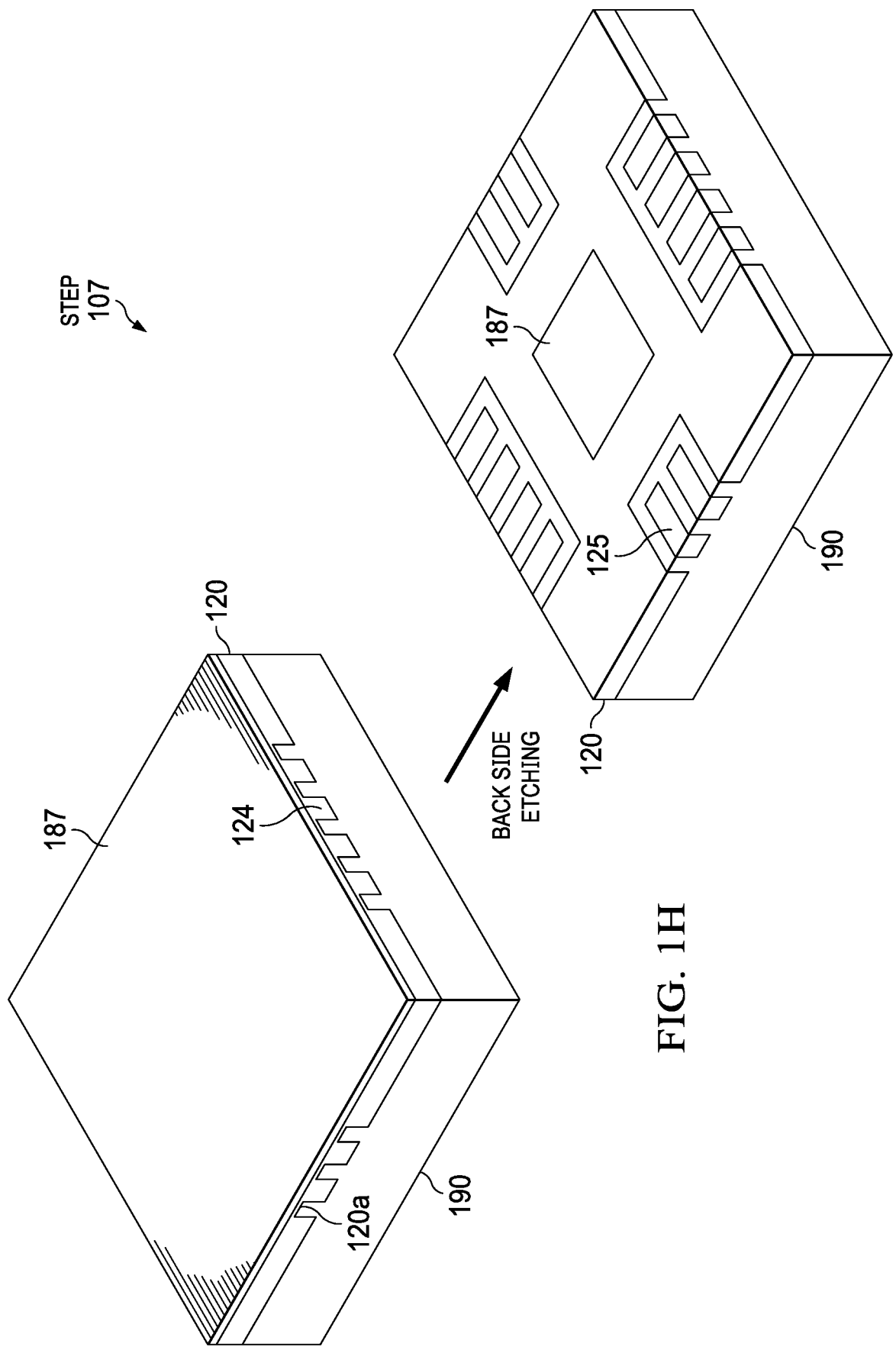
FIG. 1H shows the results before and after back side etching to electrically isolate the precursors for the metal pads to form the metal pads which are electrically isolated from one another, with the gaps between the metal pads filled with mold compound to complete a disclosed leadless packaged semiconductor device.

Step 105 comprises wire bonding between the bond pads 181 and the precursors for the metal pads 124, with the result shown in FIG. 1F. Step 106 comprises molding to form a mold compound 190 with the result shown in FIG. 1G. The mold compound 190 also fills in between the precursors for the metal pads 124.

Step 107 comprises back side etching to etch through the metal die attach layer 187 over the partial etch regions 120a and then remove the partial etch regions 120a to expose the mold compound 190. As described above the partial etch regions 120a are comparatively thin relative to the remainder of the metal substrate 120. This back side etching electrically isolates the precursors for the metal pads 124 to form the metal pads 125 which are electrically isolated from one another, with the gaps between the metal pads 125 filled with mold compound 190, with the structure shown before and after back side etching in FIG. 1H.

Electrochemical etching also known as electroetching can be used for the back side etching in step 107 that enables maskless etching for etching through the metal die attach layer 187 (which as described above is relatively thin) over the thinned metal substrate regions 120a and the thinned metal substrate regions 120a thereunder. Alternatively an etch mask (such as a solder masking layer) can be used for the back side etching to etch through the metal die attach layer 187 and the thinned metal substrate regions 120a thereunder: The metal die attach layer 187 after back side etching generally does not extend out beyond the first through-hole aperture.

Electroetching is a metal etching process that involves the use of a solution of an electrolyte, an anode, and a cathode. The metal article to be electro etched is connected to the positive terminal of a source of direct electric current. A piece of generally the same metal material is connected to the negative terminal of the direct current source and termed the cathode. Similarly the cation of the electrolyte should generally be of the same metal material as well. When the current source is turned on, the metal of the anode is dissolved and converted into the same cation as in the electrolyte and at the same time an equal amount of the cation in the solution is converted into metal and deposited on the cathode.

Figure 2A:
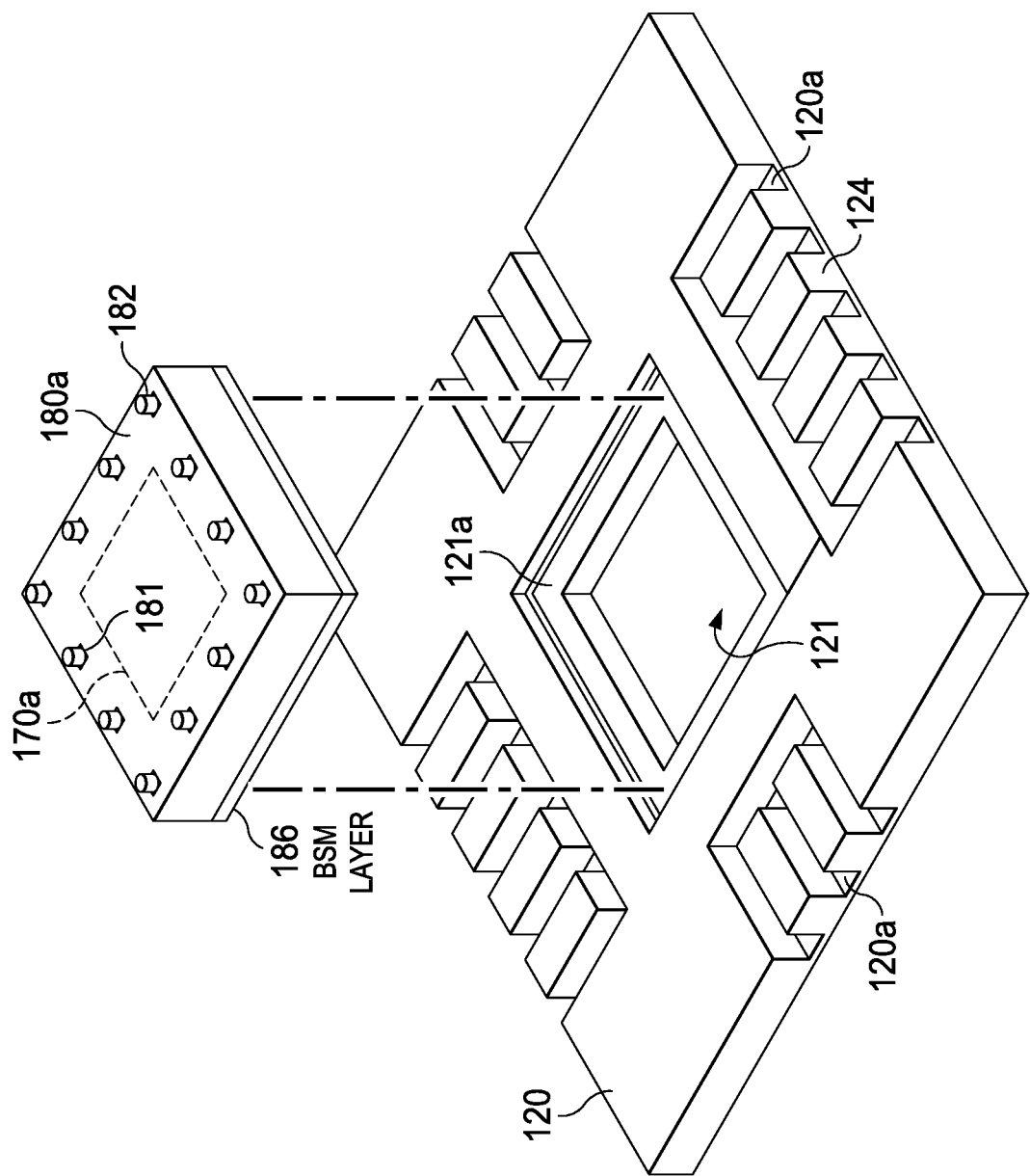
FIG. 2A is a top perspective view of an example leadless packaged semiconductor device before die placement onto a metal substrate having a through-hole aperture, formation of the metal die attach layer between a BSM layer on the back side of the semiconductor die on the metal substrate over the through hole aperture, back side etching to form isolated metal pads, and molding to form a mold compound that fills in between the metal pads.

FIG. 2A is a top perspective view of an example leadless packaged semiconductor device before placement of the first semiconductor die 180a back side down onto a metal substrate 120 having a first through-hole aperture 121a and a first ring 121a$_1$, formation of the metal die attach layer 187 between the BSM layer 186 on the back side of the first semiconductor die 180a on the metal substrate 120 over the first through hole aperture 121a, molding to form a mold compound (see mold compound 190 in FIG. 2B described below) that fills between the precursor for the metal pads 124, and back side etching to form isolated metal pads 125 from precursors of the metal pads 124. Metal pillars 182 that may be solder capped are shown on the bond pads 181 of the first semiconductor die 180a. As an alternative to metal pillars, the bond pads 181 may be used alone for wire bonding, or they may comprise solder bumps on the bond pads 181.

Figure 2B:
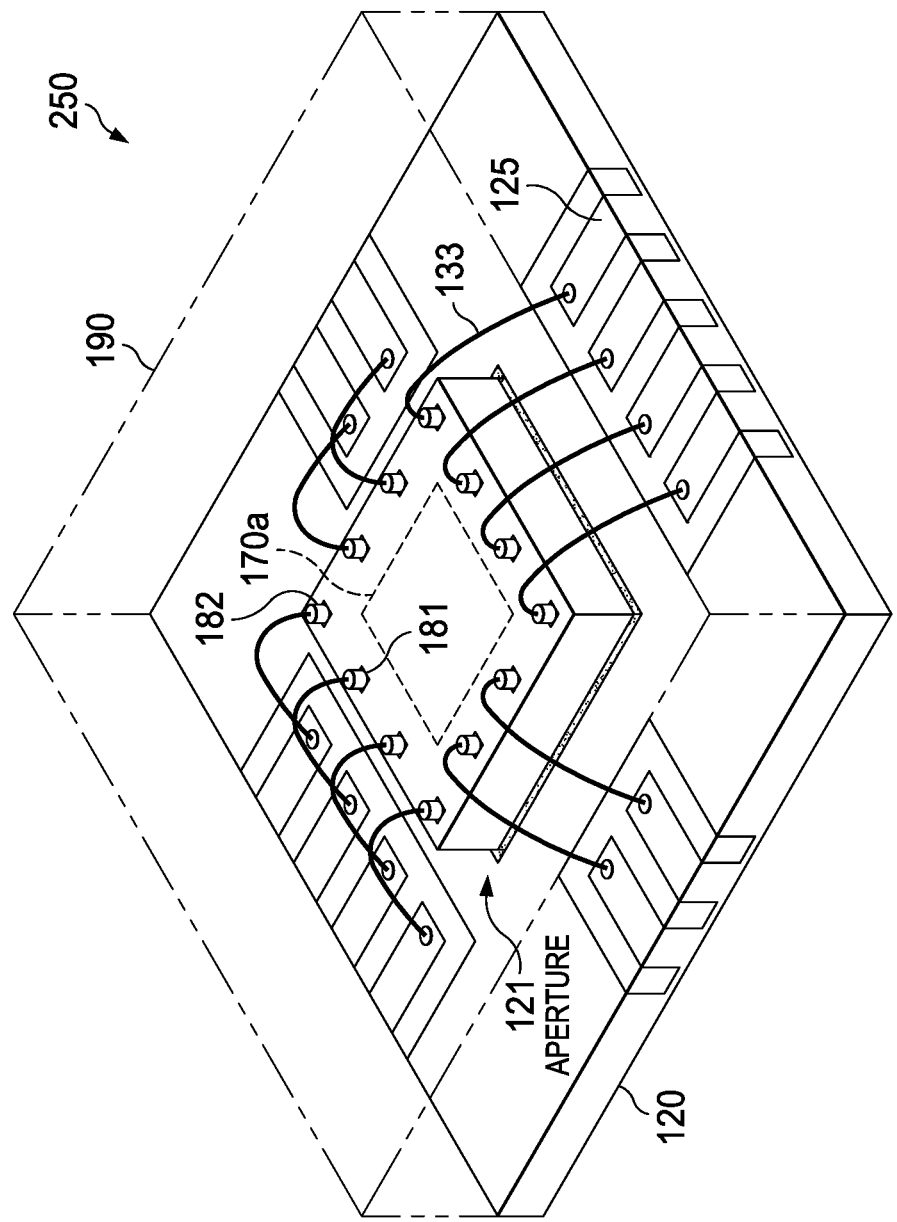
FIG. 2B is a top perspective view of an example leadless packaged semiconductor device on a metal substrate, where the BSM layer is directly attached onto the metal substrate by a disclosed metal die attach layer, and bond pads on the semiconductor die are wire bonded to the metal pads that are electrically isolated from one another by a mold compound, according to an example aspect.

FIG. 2B is a top perspective view of the example leadless packaged semiconductor device 250 shown as a 12 lead QFN package on a metal substrate 120 after back side etching and wire bonding, where the BSM layer 186 is directly attached onto the metal substrate 120 by a metal die attach layer 187, where the metal pillars 182 on the bond pads 181 on the first semiconductor die 180a are wire bonded by bond wires 133 to the bond pads 181.

Figure 3A:
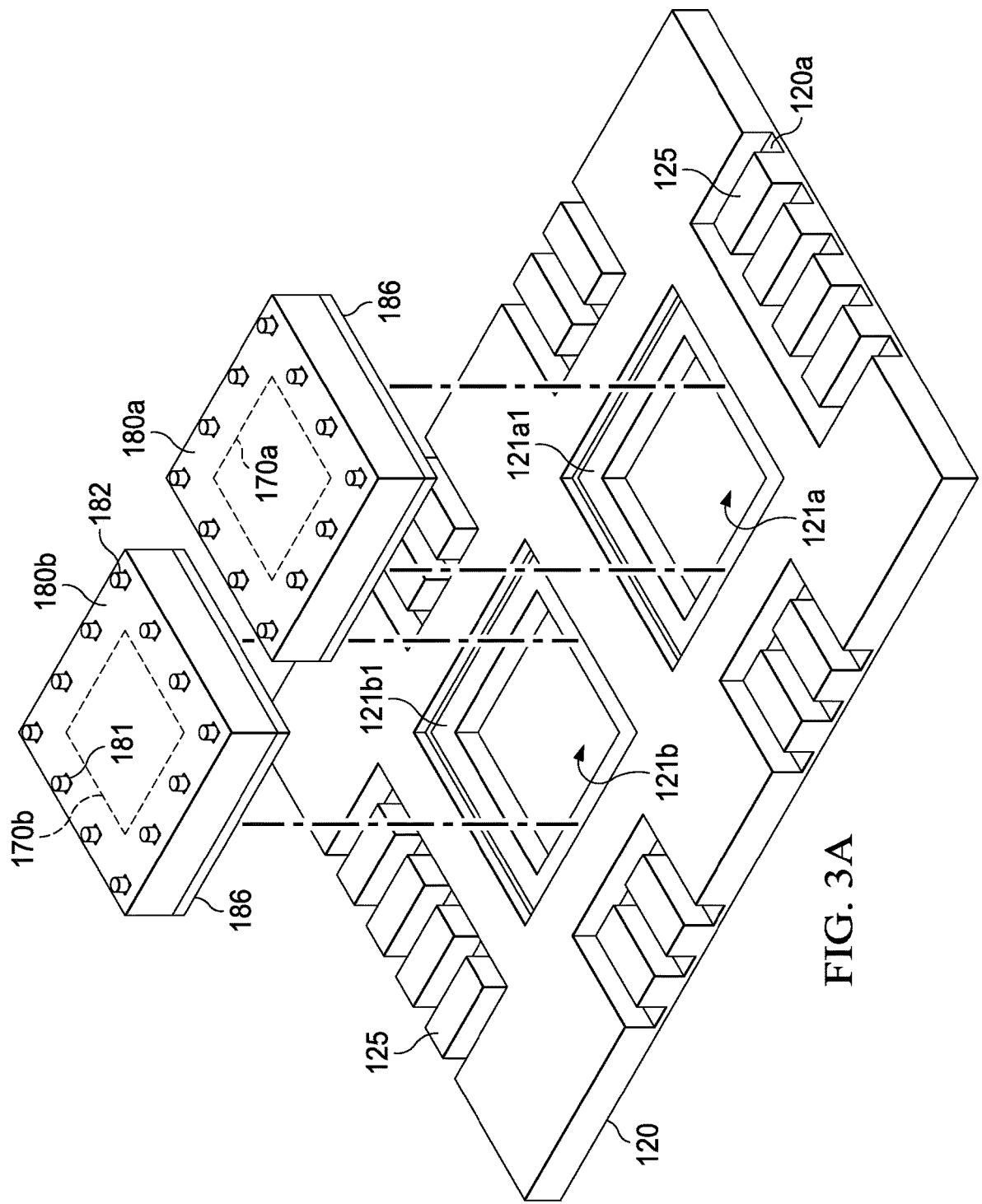
FIG. 3A and FIG. 3B show an in-process and a completed multi-chip leadless packaged semiconductor device, respectively, having a first and a second semiconductor die with a BSM layer directly attached onto a metal substrate by a disclosed metal die attach layer, and where bond pads on the semiconductor die are wire bonded to metal pads that are electrically isolated from one another by a mold compound, according to an example aspect.
Figure 3B:
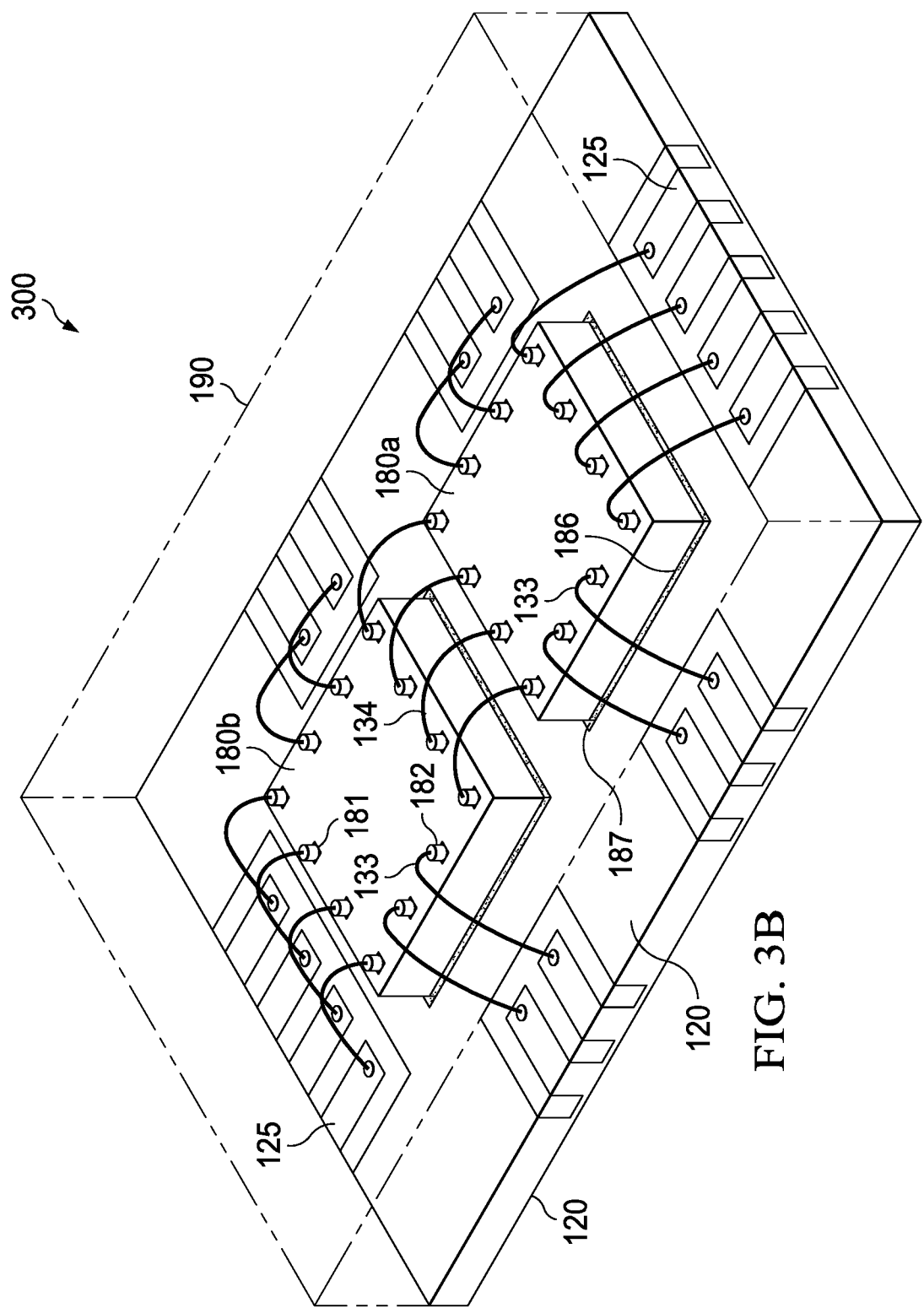

FIG. 3A and FIG. 3B show an in-process leadless package semiconductor device before placement of the semiconductor die 180a, 180b bottom side down onto a metal substrate 120 having first and second through-hole apertures 121a, 121b, formation of the metal die attach layer 187 between a BSM layer 186 on the semiconductor die 180a, 180b on the metal substrate 120 over the through hole apertures, metal etching to form isolated metal pads (see metal pads 125 in FIG. 2B), and molding to form a mold compound (see mold compound 190 in FIG. 3B) that fills between the metal pads 125. Metal pillars 182 are shown on the bond pads 181, that as shown in FIG. 3B are wire bonded by bond wires 133 to the metal pads 125. There are also bond wires 134 shown making electrical connections between the first and second semiconductor die 180a, 180b.

Disclosed aspects can be integrated into a variety of assembly flows to form a variety of different leadless packaged semiconductor devices and related products. The assembly can comprise single semiconductor die or multiple semiconductor die, such as package on package (PoP) configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A leadless packaged semiconductor device, comprising:
a metal substrate including at least a first through-hole aperture having a first outer ring and a plurality of cuts through the metal substrate to define a spaced apart plurality of metal pads on at least two sides of the first through-hole aperture;
at least a first semiconductor die that has a back side metal (BSM) layer on its bottom side and a top side with circuitry coupled to bond pads mounted top side up on the first outer ring;
a metal die attach layer directly between the BSM layer and walls of the metal substrate bounding the first through-hole aperture to provide a die attachment that fills a bottom portion of the first through-hole aperture;
bond wires between the metal pads and the bond pads, and
a mold compound including between adjacent ones of the metal pads.

2. The leadless packaged semiconductor device of claim 1, wherein the metal die attach layer consists of a single layer and is 10 µm to 250 µm thick.

3. The leadless packaged semiconductor device of claim 2, wherein the BSM layer, the metal substrate, and the metal die attach layer all comprise copper.

4. The leadless packaged semiconductor device of claim 1, wherein the metal die attach layer is an electroplated metal layer.

5. The leadless packaged semiconductor device of claim 1, further comprising metal pillars on the bond pads.

6. The leadless packaged semiconductor device of claim 1, wherein the at least a first through-hole aperture further comprises a second through-hole aperture having a second outer ring;
further comprising a second semiconductor die having the BSM layer on its bottom side and a top side with circuitry coupled to bond pads mounted top side up on the second outer ring; and
a metal die attach layer directly between the BSM layer and walls of the metal substrate bounding the second through-hole aperture to provide a die attachment that fills a bottom portion of the second through-hole aperture.

7. The leadless packaged semiconductor device of claim 6, further comprising bond wires between other bond pads on the first semiconductor die and other bond pads on the second semiconductor die.

8. The leadless packaged semiconductor device of claim 1, wherein the leadless packaged semiconductor device comprises a quad flat no lead (QFN) package.

9. The IC package of claim 1, wherein the metal die attach layer does not extend out beyond the first through-hole aperture.

10. A leadless packaged semiconductor device, comprising:
a metal substrate including at least a first through-hole aperture having a first outer ring and a plurality of cuts through the metal substrate to define a spaced apart plurality of metal pads on at least two sides of the first through-hole aperture;
at least a first semiconductor die that has a back side metal (BSM) layer on its bottom side and a top side with circuitry coupled to bond pads mounted top side up on the first outer ring;
a metal die attach layer directly between the BSM layer and walls of the metal substrate bounding the first through-hole aperture to provide a die attachment that fills a bottom portion of the first through-hole aperture; and
a mold compound including between adjacent ones of the metal pads.

11. A method of making a leadless packaged semiconductor device, comprising:
providing a metal substrate including at least a first through-hole aperture having a first outer ring and a plurality of cuts through the metal substrate to define a spaced apart plurality of metal pads on at least two sides of the first through-hole aperture;
providing at least a first semiconductor die that has a back side metal (BSM) layer on its bottom side and a top side with circuitry coupled to bond pads mounted top side up on the first outer ring;
forming a metal die attach layer directly between the BSM layer and walls of the metal substrate bounding the first through-hole aperture to provide a die attachment that fills a bottom portion of the first through-hole aperture;
forming bond wires between the metal pads and the bond pads, and
forming a mold compound including between adjacent ones of the metal pads.

12. The method of claim 11, wherein the metal die attach layer consists of a single layer and is 10 µm to 250 µm thick.

13. The method of claim 12, wherein the BSM layer, the metal substrate, and the metal die attach layer all comprise copper.

14. The method of claim 11, wherein the metal die attach layer is an electroplated metal layer.

15. The method of claim 11, further comprising forming metal pillars on the bond pads.

16. The method of claim 11, wherein the at least a first through-hole aperture further comprises a second through-hole aperture having a second outer ring;
further comprising providing a second semiconductor die having the BSM layer on its bottom side and a top side with circuitry coupled to bond pads mounted top side up on the second outer ring; and
forming a metal die attach layer directly between the BSM layer and walls of the metal substrate bounding the second through-hole aperture to provide a die attachment that fills a bottom portion of the second through-hole aperture.

17. The method of claim 16, further comprising forming bond wires between other bond pads on the first semiconductor die and other bond pads on the second semiconductor die.

18. The method of claim 11, wherein the leadless packaged semiconductor device comprises a quad flat no lead (QFN) package.

19. The method of claim 11, wherein the metal die attach layer does not extend out beyond the first through-hole aperture.

20. A method of making a leadless packaged semiconductor device, comprising:
providing a metal substrate including at least a first through-hole aperture having a first outer ring and a plurality of cuts through the metal substrate to define a spaced apart plurality of metal pads on at least two sides of the first through-hole aperture;

providing at least a first semiconductor die that has a back side metal (BSM) layer on its bottom side and a top side with circuitry coupled to bond pads mounted top side up on the first outer ring;

forming a metal die attach layer directly between the BSM layer and walls of the metal substrate bounding the first through-hole aperture to provide a die attachment that fills a bottom portion of the first through-hole aperture; and forming a mold compound including between adjacent ones of the metal pads.

\* \* \* \* \*